United States Patent [19]

White

[11] Patent Number: 5,535,526
[45] Date of Patent: Jul. 16, 1996

[54] APPARATUS FOR SURFACE MOUNTING FLIP CHIP CARRIER MODULES

[75] Inventor: Lawrence H. White, Vestal, N.Y.

[73] Assignee: International Business Machines Corporation, Armonk, N.Y.

[21] Appl. No.: 450,845

[22] Filed: May 25, 1995

Related U.S. Application Data

[62] Division of Ser. No. 178,994, Jan. 7, 1994, Pat. No. 5,473,814.

[51] Int. Cl.⁶ ................................ F26B 21/06
[52] U.S. Cl. .................... 34/78; 228/6.2; 228/8; 228/180.22; 29/874; 29/739; 34/80
[58] Field of Search ............... 228/6.2, 8, 180.22; 29/739, 874; 34/77, 78, 80, 181, 202

[56] References Cited

U.S. PATENT DOCUMENTS

| | | |
|---|---|---|
| 3,657,790 | 4/1972 | Larrison .................... 228/8 X |
| 4,836,434 | 6/1989 | Takenaka et al. ............ 228/8 X |
| 4,996,939 | 3/1991 | D'Amato .................... 34/78 X |
| 5,142,873 | 9/1992 | Ramsey, Jr. ................ 34/78 X |

*Primary Examiner*—John M. Sollecito
*Assistant Examiner*—Steve Gravini
*Attorney, Agent, or Firm*—Michael E. Belk

[57] ABSTRACT

A process for handling and storing surface-mount, encapsulated flip-chip carrier modules to prevent the formation of amoeba-like solder bridges between the flip-chip C4 connections along the boundary between the encapsulant and the chip surface and/or between the encapsulant and the chip carrier substrate surface. The concentration of free moisture in the encapsulant is maintained below a predetermined safe limit during reflow heating used to mount the modules on a circuit board.

15 Claims, 10 Drawing Sheets

APPARATUS FOR SURFACE MOUNTING FLIP CHIP CARRIER MODULES

This is a divisional of application Ser. No. 08/178,994 filed on Jan. 7, 1994 now U.S. Pat. No. 5,473,814.

FIELD OF THIS INVENTION

This invention relates to a process for manufacturing an information handling system and specifically for surface mount attachment of modules carrying encapsulated flip-chips and more specifically a process for grid-array, solder-ball/column attachment to organic circuit boards of organic substrate carrier modules having epoxy encapsulated C4 connected chips.

BACKGROUND OF THIS INVENTION

Solder ball connections have been used for mounting ICs (integrated computer chips) using the C-4 (controlled collapse chip connection) technology since first described in U.S. Pat. Nos. 3,401,126 and 3,429,040 by Miller. *Packaging Electronic Systems* by Dally (McGraw-Hill 1990 p. 113) describes flip chip or C-4 connections. In Dally, "Chip bond pads are deployed in an area array over the surface of the chip . . . These bonding pads are 5 mil in diameter on 10 mil centers. Matching bonding pads are produced on a ceramic substrate so that the pads on the chip and the ceramic coincide. Spheres of solder 5 mil in diameter are placed on the ceramic substrate pads . . . and the chip is positioned and aligned relative to the substrate. The assembly is heated until the solder spheres begin to soften and a controlled collapse of the sphere takes place as the solder simultaneously wets both pads. A myriad of solder structures have been proposed for mounting IC chips as well as for interconnection to other levels of circuitry and electronic packaging."

"Ball grid arrays: the hot new package" by Terry Costlow and "Solder balls make connections" by Glenda Derman both in Electronic Engineering Times Mar. 15, 1993, describe using solder balls to connect ceramic or flexible chip carriers to circuit boards.

Fabrication of multi-layer ceramic chip carriers is described in U.S. Pat. Nos. 3,518,756; 3,988,405; and 4,202,007 as well as "A Fabrication Technique For Multi-Layer Ceramic Modules" by H. D. Kaiser et al., Solid State Technology, May 1972, pp. 35–40 and "The Third Dimension in Thick-Films Multilayer Technology" by W. L. Clough, Microelectronics, Vol. 13, No. 9 (1970), pp. 23–30.

Fabrication of organic circuit boards is described in U.S. Pat. Nos. 3,554,877; 3,791,858; and 3,554,877. Thin film Techniques are described in U.S. Pat. Nos. 3,791,858.

U.S. Pat. No. 4,604,644 to Beckham describes materials and structures for encapsulating C-4 connections. U.S. Pat. Nos. 4,701,482 to Itoh and (Ser. No. 493,126 Mar. 14, 1990) to Christie et al. disclose epoxies and guidance in selecting epoxies for electronic applications.

Use of epoxy encapsulants to enhance fatigue life of flip chip connection is described in: D. Suryanarayana, R. Hsiao, T. P. Gall, J. M. McCreary, "Enhancement of Flip-Chip Fatigue Life by Encapsulation" *IEEE Transactions on Components and Hybrids, and Manufacturing,* Vol. 14, No. 1, pp. 218–223(1991);

J. Clementi, J. McCreary, T. M. Niu, J. Palomaki, J. Varcoe and G. Hill, "Flip Chip Encapsulation on Ceramic Substrates" *Proc. of 43rd Electronic Components & Technology Conference* Organized by IEEE at Orlando, Fla., June 1993, p. 175; D. O. Powell, and A. K. Trivedi, "Flip-chip on FR-4 Integrated Circuit Packaging", *Proc. of 43rd Electronic Components & Technology Conference,* Organized by IEEE at Orlando, Fla., June 1993., p. 182; Y. Tsukada, Y. Mashimoto, T. Nishio, and N, Mil, "Reliability and Stress Analysis of Encapsulated Flip Chip Joint on Epoxy Based Printed Circuit Packaging" *Proc. of the 1992 Joint ASME/JSME Conf. on Electronic Packaging"* vol. 2, Materials, Process, Reliability, Quality Control and NDE, (1992), p. 827; D. Wang and K. I. Papathomas, "Encapsulant For Fatigue Life Enhancement of Controlled Collapse Chip Connection (C4)", *Proc. of 43rd Electronic Components & Technology Conferences,* Organized by IEEE at Orlando, Fla., June 1993, p. 780; and in U.S. Pat. Nos. 4,999,699; 5,089,440; and 5,194,930 all to Christie, et al.

Problems with moisture induced cracking of plastic surface mount components and solutions thereof are described in: R. Lin, E. Blackshear, and P. Serisky, "Moisture Induced Cracking in Plastic Encapsulated Surface Mount Components During Solder Reflow Process," IEEE IRPS, 1988, pp. 83–89; B. K. Bhattacharyya, W. A. Huffman, W. E. Jahsman, and B. Natarajan, "Moisture Absorption and Mechanical Performance of Surface Mountable Plastic Packages," IEEE, 1988; B. Miles and B. Freyman, "The Elimination of the Popcorn Phenomenon in Overmolded Plastic Pad Array Carriers (OMPAC)," Proceedings of the Technical Conference of the IEPS, Austin, Tex., September 1992; G. S. Springer, *Environmental Effects on Composite Materials,* 1981, pp. 15–33; and in IPC-SM-786, December 1990.

Flexible film chip carriers (known in the art as ATAB) are described in U.S. Pat. Nos. 4,681,654; (Ser. No 07/009,981); and 5,159,535. In ATAB a flexible circuit board chip carrier is mounted on a circuit board using solder ball connect.

U.S. Pat. No. 5,147,084 to Behun, describes using a HMP (high melting point) solder ball in association with a LMP (low melting point) solder. FIG. 1A of that patent is described as follows. "A part 10 is to be joined to a board 11. Part 10 has internal metallurgy 14 which terminates at the surface at a bonding pads 12. A . . . LMP solder 16 is applied to a bonding pad 12. A . . . HMP solder ball 18 is placed in contact with LMP solder 16 and the assembly is heated to reflow the LMP solder which then wets to the non-molten HMP solder ball . . . Board 11 is also illustrated with internal metallurgy 15, terminating on the surface bonding pad 17 . . . the assembled part 10 . . . is brought into contact with part 11 having pad 17 and LMP solder 13, and the two are heated to a temperature sufficient to reflow the LMP solder but not sufficient to reflow the LMP solder but not sufficient to melt the HMP solder ball. The LMP solder 13 which is attached to the bonding pad 17, on board 11, will wet the HMP ball and connection will be achieved."

All these above, sources are hereby incorporated by reference.

OBJECTS OF THIS INVENTION

Therefore, It is an object of this invention to provide a surface mount process for manufacturing information handling systems.

More specifically, it is an object to reliably surface mount, to a circuit board surface, a chip carrier having encapsulated flip chips.

It is further an object of this invention to define the storage and handling procedures for surface mount chip carriers having encapsulated flip-chips before reflow soldering.

SUMMARY OF THIS INVENTION

In this invention it was discovered that when surface mount chip carrier substrates, having C4 chips attached using low melting temperature joining materials, are reflow connected to circuit boards, solder bridges form between the C4 connections along the boundary between the encapsulant and the chip or the carrier substrate. Upon examination, the bridges often have the flat irregular appearance of an amoeba formed around the C4 solder joint and thus will be referred to as amoebas herein. The amoebas formed even though the temperature of the module was below the melting temperature of the C4 solder. Furthermore it was discovered that minimizing moisture in the encapsulant at the time of reflow prevented the formation of these amoebas.

The invention of applicants includes the following base processes:

A process for handling and storing surface-mount, flip-chip substrates, comprising the steps of:
  producing a chip carrier substrate;
  connecting a flip chip directly to the chip carrier substrate using solder connections with the chip separated from the substrate by a volume;
  preventing formation of amoebas during subsequent surface-mount, solder reflow connection by preventing diffusion of sufficient moisture from the ambient atmosphere into the encapsulant to cause amoebas to form during the reflow soldering.

A process for manufacturing an interconnect assembly, comprising the steps of:
  producing a chip carrier substrate;
  connecting a flip chip directly to the chip carrier substrate using solder connections with the chip separated from the substrate by a volume;
  encapsulating the volume between the flip chip and the carrier substrate with organic material to protect the solder connections;
  providing a circuit board with an array of surface contacts for surface mount connection of the chip carrier;
  reflow soldering the chip carrier substrate to surface connections of the circuit board;
  preventing the information of amoebas during the reflow soldering by preventing the diffusion of sufficient moisture into the encapsulant to cause amoebas to form during the reflow soldering.

A process for manufacturing and information handling system, comprising the steps of:
  producing a chip carrier substrate;
  connecting a flip chip directly to the chip carrier substrate using solder connections with the chip separated from the substrate by a volume;
  encapsulating the volume between the flip chip and the carrier substrate with organic material to protect the solder connections;
  providing a circuit board with an array of surface contacts for surface mount connection of the chip carrier;
  reflow soldering the chip carrier substrate to surface contacts of the circuit board;
  preventing the formation of amoebas by preventing the diffusion of sufficient moisture into the encapsulant to cause amoebas to form during reflow soldering;
  mounting the circuit board in an enclosure;
  connecting signal I/O means for communicating with computer peripherals to the circuit board;
  connecting power supply means to the circuit board.

The invention of applicants also includes the following more specific processes applied to any of the proceeding base processes:

A process in which the step of preventing formation of amoebas includes storing the chip carrier at an elevated temperature before reflow.

The immediately proceeding process in which the elevated temperature is at least about 40° C.

A process in which the step of preventing formation of amoebas includes storing the chip carrier in a sealed approximately air tight bag before reflow.

The immediately proceeding process in which the sealed bag also contains desiccant.

A process in which the step of preventing formation of amoebas includes baking the chip carrier at a temperature of at least about 100° C. for at least about 12 hours.

The immediately proceeding process in which the chip carrier is baked at a temperature of about 125° C. for about 24 hours.

A process in which the step of preventing formation of amoebas includes reflow soldering the chip carrier to the circuit board before the chip has been exposed to ambient atmosphere for more than one week since fabrication or baking at an elevated temperature.

Note that for this purpose baking at a sufficiently elevated temperature for a sufficient length of time (preferably at least 100° C. for at least 12 hours and more preferably at about 125° C. for at least 24 hours) is equivalent to fabrication with regard to reducing diffused moisture.

A process in which producing the carrier substrate includes producing a layer of ceramic material.

A process in which producing the carrier substrate includes laminating flexible layers of polyimide and copper foil.

A process in which producing the carrier substrate includes forming a rigid board of organic material reinforced by fibers.

The immediately proceeding process in which the fibers include glass or teflon or kevlar.

This invention will be described in greater detail in reference to the following drawing.

DESCRIPTION OF EMBODIMENTS INCLUDING THE BEST MODE

Figure 1:
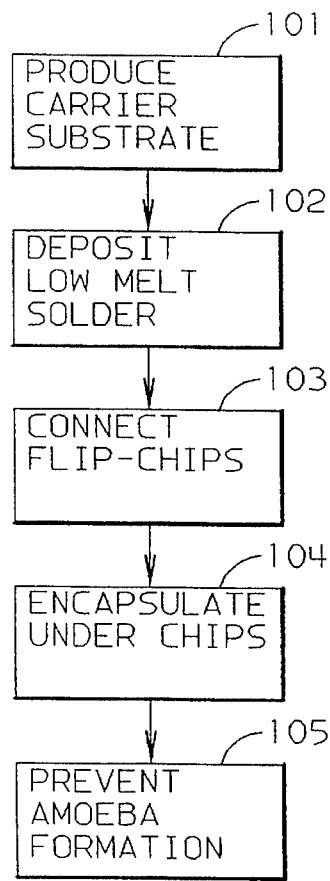
FIG. 1 illustrates an embodiment the process of the invention for handling/storing chip carrier to prevent amoebas.

FIG. 1 illustrates an embodiment the process of the invention for handling/storing chip carriers to prevent amoebas. In step 101, a carrier substrate is produced. The substrate my be a ceramic substrate, an organic substrate (which may be reinforced with teflon, kevlar or fiberglass such as FR-4), or a flexible polyimide substrate (lamination of alternating polyimide films and patterned copper foils). One of the two major substrate surfaces (sides) contains a first array of exposed metal contacts (such as copper pads) for connection of a flip chip. Additional flip chip attachment arrays may be provided for additional flip chips and/or wire bond chips on the same and/or the other side of the substrate. The substrate may be a quad flat pack or similar package with edge leads for surface mounted attachment to a circuit board or the substrate may have a second array of exposed metal contacts on which are attached metal balls (such as high temperature solder) or solder columns, and which provide for grid array connection to a circuit board. The columns may be attached prior to the flip-chips or attached subsequent thereto.

In step 102, a low melting temperature electrically conductive joining material such as flattened bump of eutectic solder, is deposited for connecting a flip chip to the first contact array to form solder bumps. The joining material may be deposited on the exposed surface of each contact or may be deposited on the distal ends of high melting temperature solder bumps on the flip chip. In step 103, a flip chip with projections of joining material, such as high melting temperature C4 solder bumps, is connected to the substrate. The chip is positioned on the first grid array of low melting temperature solder bumps. If more than one flip-chip is to be connected they are positioned on the other flip chip connection arrays. Then the substrate is heated to reflow solder the chip(s) onto the substrate. In step 104, encapsulant is flowed under the chip to surround all the connections between the chip and the substrate. The encapsulant protects the connections from environmental hazards and reduces thermal fatigue. The resulting module is now ready for attachment to a circuit board. If multiple substrates are batch produced as one panel, the panel is cut up into individual modules.

In step 105, formation of amoebas Is prevented during reflow heating for surface mounting the module onto a circuit board. It was discovered that if the encapsulant contained sufficient moisture then high reflow temperatures separates the encapsulant from the chip and/or substrate and extrudes the low melting point joining material into the boundary space formed between the encapsulant and the chip or substrate. For eutectic solder joining material when the chip attachment is dissected, the extruded material has an amoeba-like appearance.

The formation of these amoebas can be prevented by providing a low concentration of free moisture in the encapsulant. Current encapsulants absorb moisture from the ambient atmosphere if relative humidity (RH) is sufficiently high. For example, for a the currently preferred encapsulant (Hysol FP4511) when exposed to 60% RH at ambient temperatures and pressures, absorbs sufficient moisture in excess of about 3 days (72 hours) to initiate the formation of amoebas. A different encapsulant may be used which absorbs less water. Hermetic sealing of the encapsulant will prevent exposure to humidity (for example an aluminum cap may be provided for a ceramic module). The modules may be stored in air tight bags preferably with desiccant until the time of use. The modules may be baked prior to use to drive excess moisture from the encapsulant. The modules may be stored in a heated room to provide very low relative humidity until use. The time of exposure to air may be monitored to prevent use of modules which may have absorbed too much humidity.

Preferably, the modules are baked subsequent to encapsulation and then stored in air tight bags with desiccant until near to the time of use. After unpacking the bags, the time of exposure to humid conditions is measured and if exposure time is exceeded for the existing conditions then the modules are baked. For example it was found that baking at an elevated temperature for a sufficient time reduced moisture below critical levels. For example, baking at a temperature of at least 125° C. for at least 24 hours immediately prior to use prevented the formation of amoebas even for modules which were saturated by intentional storage at high humidity levels.

Figure 2:
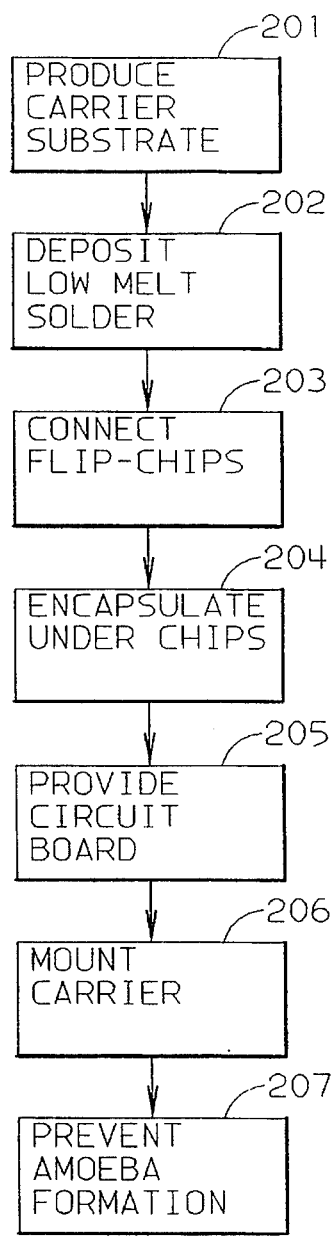
FIG. 2 illustrates another embodiment of the process of this invention for producing an interconnect structure.

FIG. 2 illustrates another embodiment of the process of this invention for producing an interconnect structure. Steps 201 through 204 correspond approximately to steps 101 through 104 of FIG. 1 and will not be further described.

In step 205 a circuit board is provided for surface mount attachment of the module. The circuit board may be of any known type such as a ceramic or flexible card but is typically an FR 4 multi-layer board. The circuit board includes an array of metal contacts on its surface.

In step 206, the module is surface mounted onto the circuit board. A low temperature joining material is positioned between the contacts and the leads or solder balls/columns of the module and the structure is heated to reflow solder the module to the circuit board. For example, eutectic solder may be deposited on the contacts and then the module positioned with leads or solder balls/columns on the circuit board contacts.

In step 207, the formation of amoebas is prevented. In addition to the method discussed above for step 105 of FIG. 1, amoebas may be prevented by using a lower temperature joining material for module to circuit board joining than for chip to module joining. For example, about eutectic 37/63% Pb/Sn solder may be used to join the leads/balls/columns of the module to the circuit board and a Pb/Sn solder with a significantly higher lead content (such as 50% to 90% Pb)

can be used for connecting the high temperature C4 connections of the flip chip to the module. Amoebas can thus be prevented by keeping reflow temperatures below the melting temperature of joining materials used connect the flip-chip to the substrate.

Figure 3:
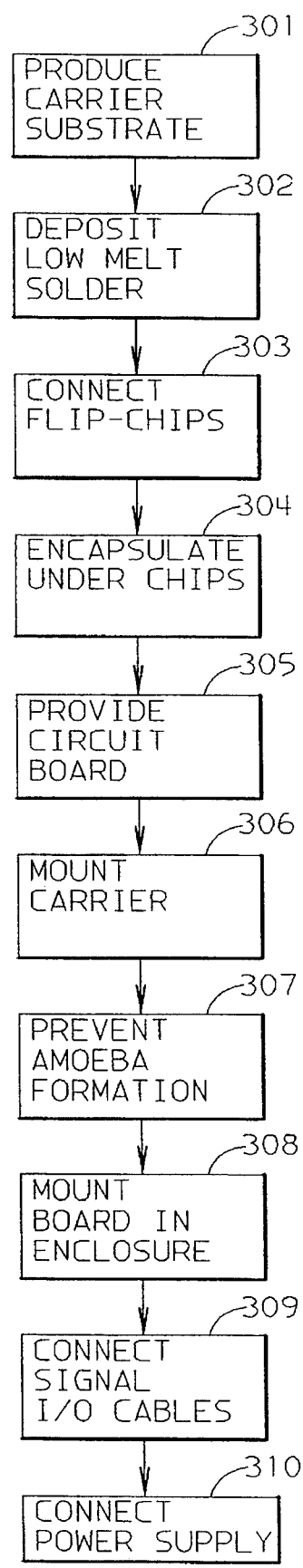
FIG. 3 illustrate the process for producing an information handling system of this invention.

If thermal processing of the interconnect structure can not be completed before the moisture content of the encapsulant increases to critical levels (e.g. about 72 hours at 60% RH), then the interconnect structures will have to be baked until safe moisture content is achieved (e.g. at about 125° C. for no more than 24 hours depending on conditions). FIG. 3 illustrates another embodiment of the process of this invention for producing an information handling system. Steps 301 through 307 correspond approximately to steps 201 through 204 of FIG. 2 and will not be further described.

In step 308, the interconnect structure resulting from the process of FIG. 2, is mounted in an enclosure to provide protection from environmental hazards. In step 309, signal input/output (I/O) cables (electrical or optic) are connected between the board and various computer peripherals and possibly between a network of the information handling systems of this invention. Finally in step 310, a power supply is connected to the interconnect structure to operate its electrical components.

Figure 4:
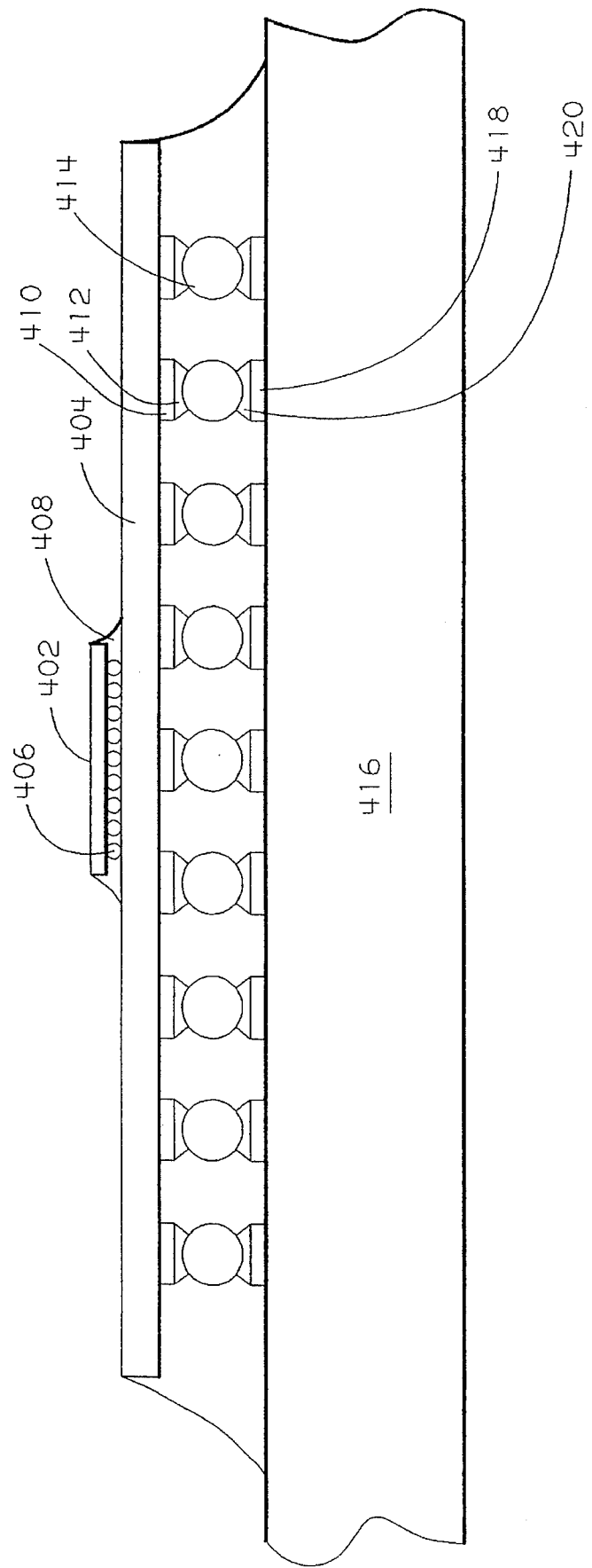
FIG. 4 is a schematic partial cross section of a specific embodiment of this invention showing a flip chip with encapsulated C4 connection to the top of an organic chip carrier and with grid array solder ball connection to part of a circuit board.

FIG. 4 is a schematic partial cross section of a specific embodiment of this invention showing flip chip 402 attached to the top of an organic chip carrier substrate 404. A grid array of C4 solder joints 406 mechanically and electrically connect between an array of metal contacts on the flip-chip and a mirror image array of metal (such as copper) contacts on the top side of the substrate. C4 connections 406 are reenforced by encapsulant 408 which fills the volume around the C4 joints under the chip and is firmly attached to both the chip and substrate to protect the C4 joints from environmental hazards and to reduce thermal fatigue in the joints.

At the bottom of the organic carrier is a second array of contacts 410 such as copper pads. A low melting temperature joining material 412 (such as about eutectic solder) connects balls 414 of a high melting temperature material (such as 90% to 97% Pb solder with the around being mostly Sn). A circuit board 416 includes contacts 418 in a mirror image array to the array of contacts on the bottom of the module. Joining material 420 is positioned immediately between balls 414 and contacts 418 and the circuit board is reflow heated to attach substrate 404 to board 416.

Figure 5:
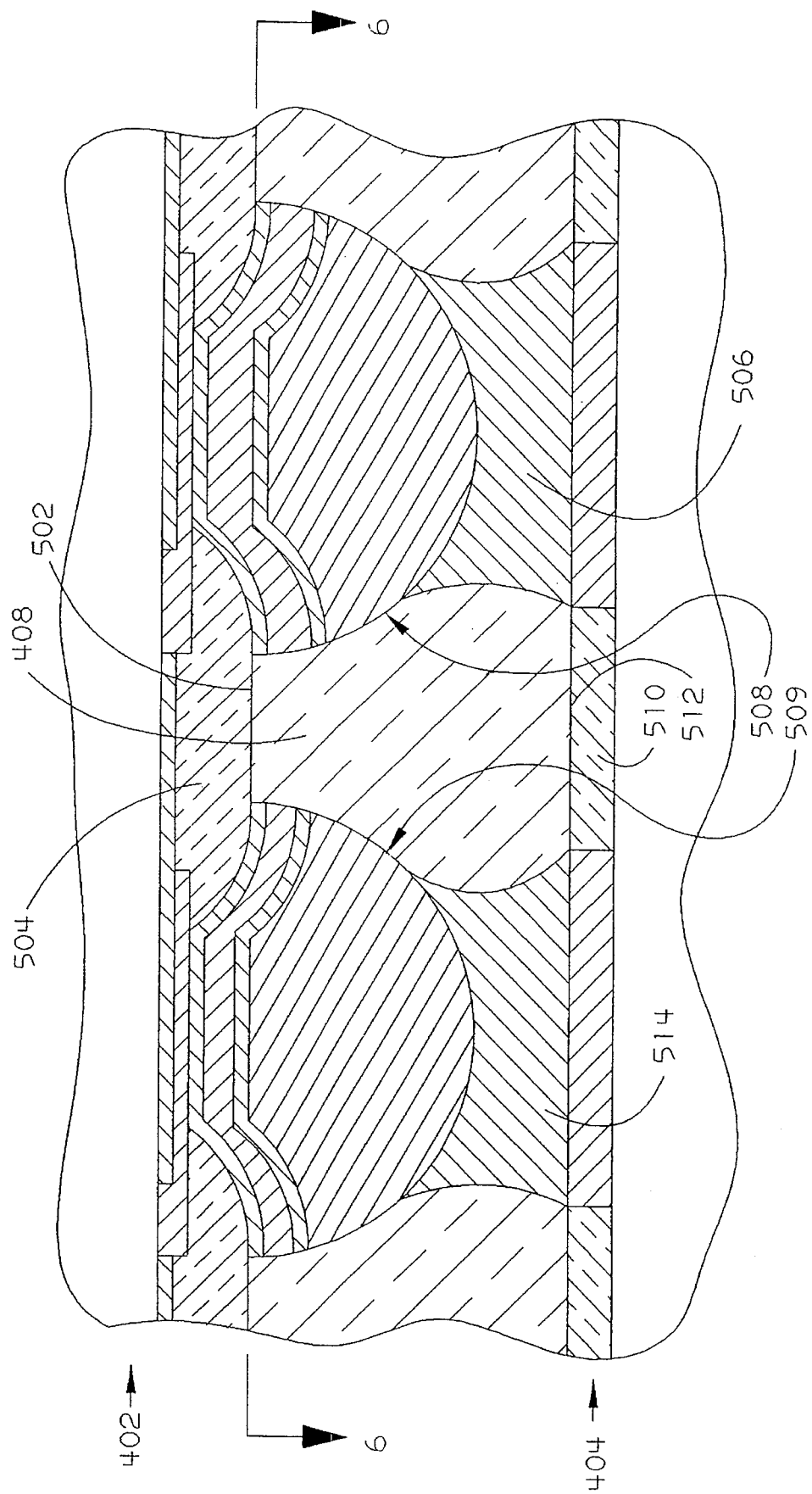
FIG.5 is a schematic partial cross section of the specific embodiment of FIG. 4 showing a part of a chip attached by the encapsulated C4 connections to the, chip carrier.

FIG. 5 is a schematic partial cross section of the specific embodiment of FIG. 4 showing a part of a chip 502 attached by encapsulated C4 connections to the chip carrier. Those skilled in the art are referred to U.S. Pat. No. 3,458,925 for details about C4 geometry. Excessive moisture in encapsulant 408, during reflow to surface mount the module to a circuit board will result in separation along the boundary between the encapsulant and a passivation layer 502 (glass, polyimide, silicon oxide) at 504. Melted low melting temperature electrically conductive joining material 506 will extrude along the boundary between the encapsulant and the high melting temperature C4 solder bump 406, and into the space created between the encapsulant and passivation layer at 504. The extruded electrically conductive material may result in electrical bridging (shorting) between the C4 connections.

Figure 6:
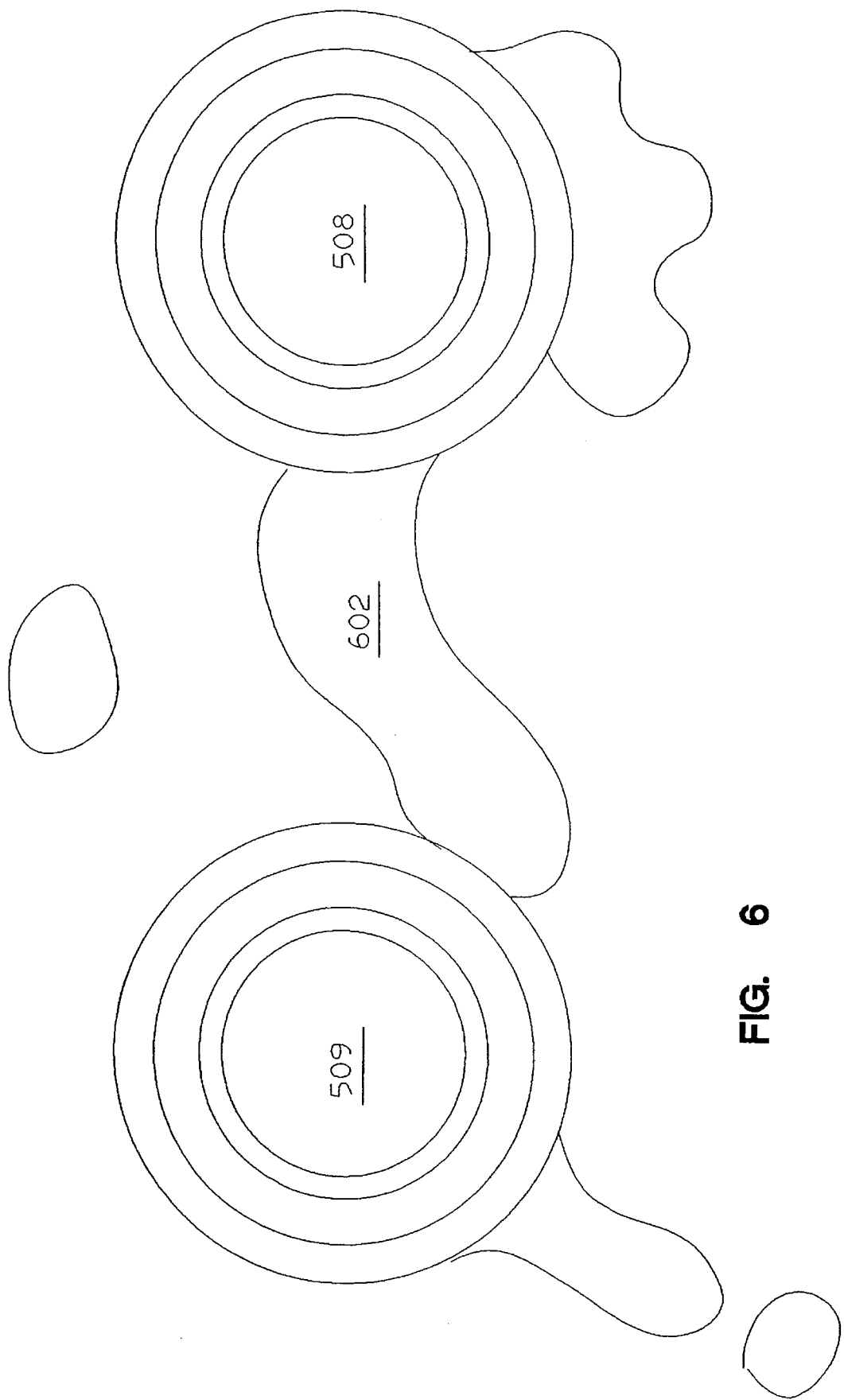
FIG. 6 is a cross section of the flip chip of FIG. 5 along lines 6—6 showing the outline of an amoeba bridging between C4 connections.

FIG. 6 is a cross section of flip chip 402 along lines 6—6 of FIG. 5 showing the outline of very thin amoeba 602 bridging between C4 connections 508 and 509.

Figure 7:
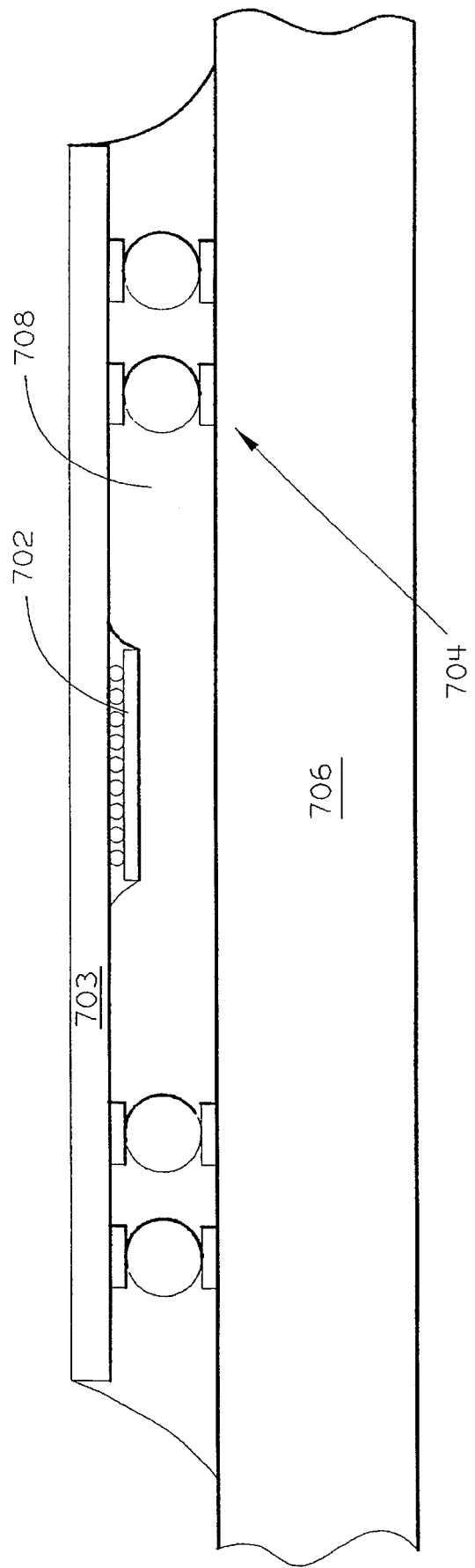
FIG. 7 is a schematic partial cross section of a specific embodiment of this invention showing a flip chip with encapsulated C4 connection to the bottom of an organic chip carrier and with grid array solder ball connection to part of a circuit board.

FIG. 7 is a schematic partial cross section of a specific embodiment of this invention similar to the embodiment of FIG. 4 showing flip chip 702 with encapsulated C4 connection to the bottom of an organic chip carrier 704 and with grid array solder ball connection 704 to part of a circuit board 706. The volume under the module is encapsulated after surface mounting to protect the chip and provide improved thermal performance.

Figure 8:
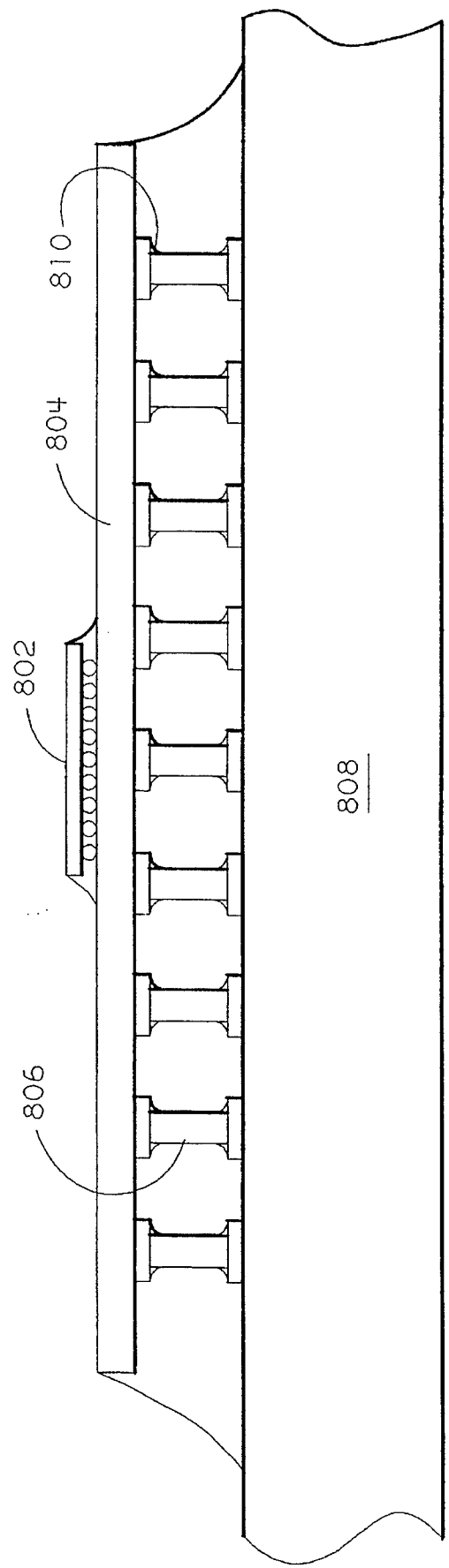
FIG. 8 is a schematic partial cross section of a specific embodiment of this invention showing a flip chip with encapsulated C4 connection to a ceramic chip carrier and with solder column connection to part of a circuit board.

FIG. 8 is a schematic partial cross section of a specific embodiment of this invention showing flip chip 802 with encapsulated C4 connection to a ceramic chip carrier 804 and with solder columns 806 connecting the module to circuit board 808. Alternately, modules with ceramic substrates may be connected using balls shown in FIG. 4 for organic chip carrier modules. The columns may be connected to contact pads on the module by casting or reflow soldering of joining material 810 as shown. Preferably the columns are connected prior to encapsulation of the flip-chip to avoid forming any amoebas.

Figure 9:
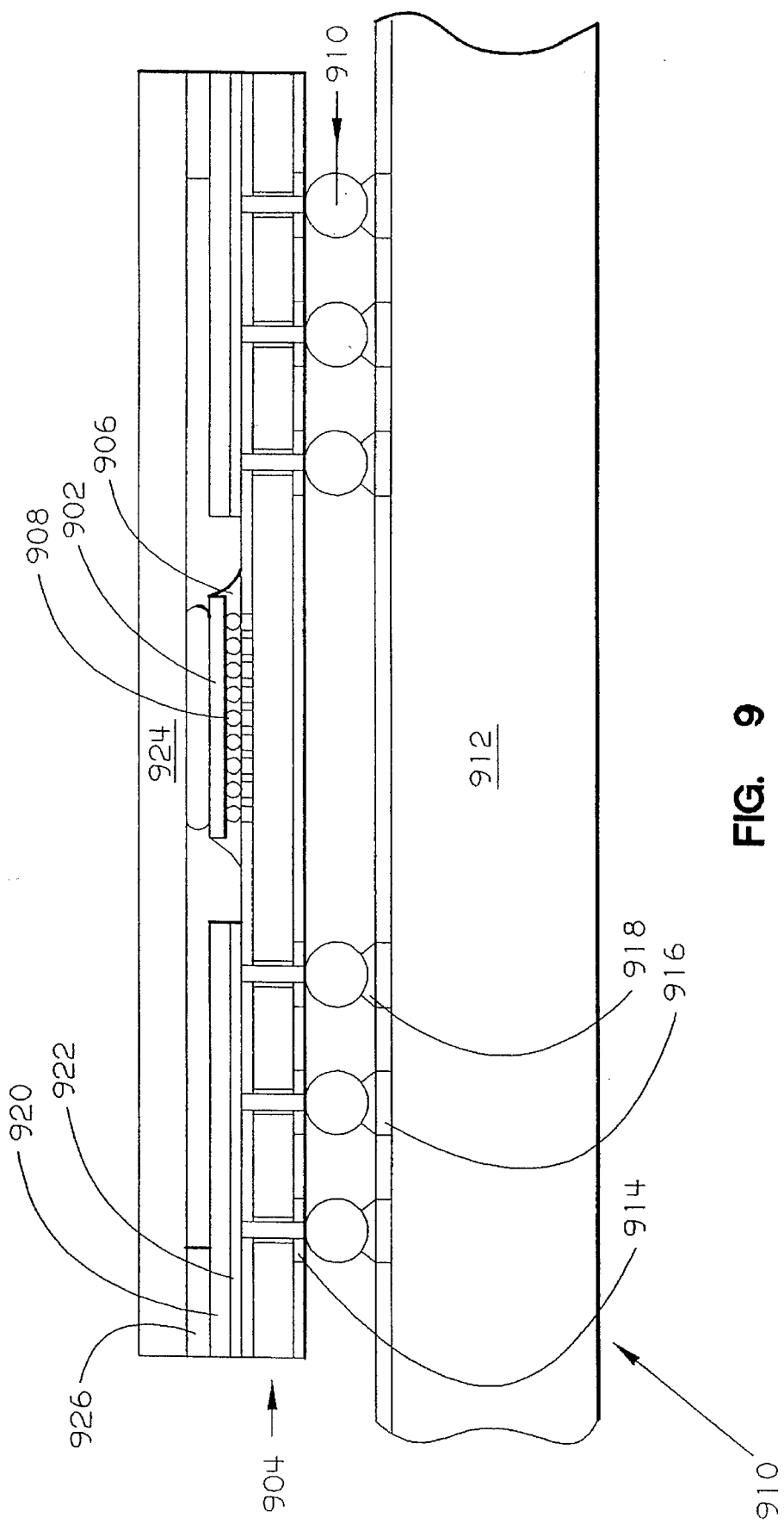
FIG. 9 is a schematic partial cross section of another specific embodiment of this invention showing a flip chip with encapsulated C4 connection on top of a flexible chip carrier and with grid array solder ball connection to part of a circuit board.

FIG. 9 is a schematic partial cross section of another specific embodiment of this invention showing flip chip 902 connected to the top of a two layer flexible substrate 904. Encapsulant 906 fills the volume around C4 connections 908. The module is connected by a grid array of solder balls 910 to circuit board 912. The solder balls are welded to contacts 910 and the module is reflow surface mount connected to contacts 912 on the circuit board using low temperature joining material 914. A frame 916 attached by adhesive 918 maintains the area of connection (to which the solder balls are attached) planar. Optionally, heat spreader 920 is attached to the frame 916 by adhesive 922. The heat spreader also provides approximate hermetic sealing to greatly extend the shelf life of the modules.

Figure 10:
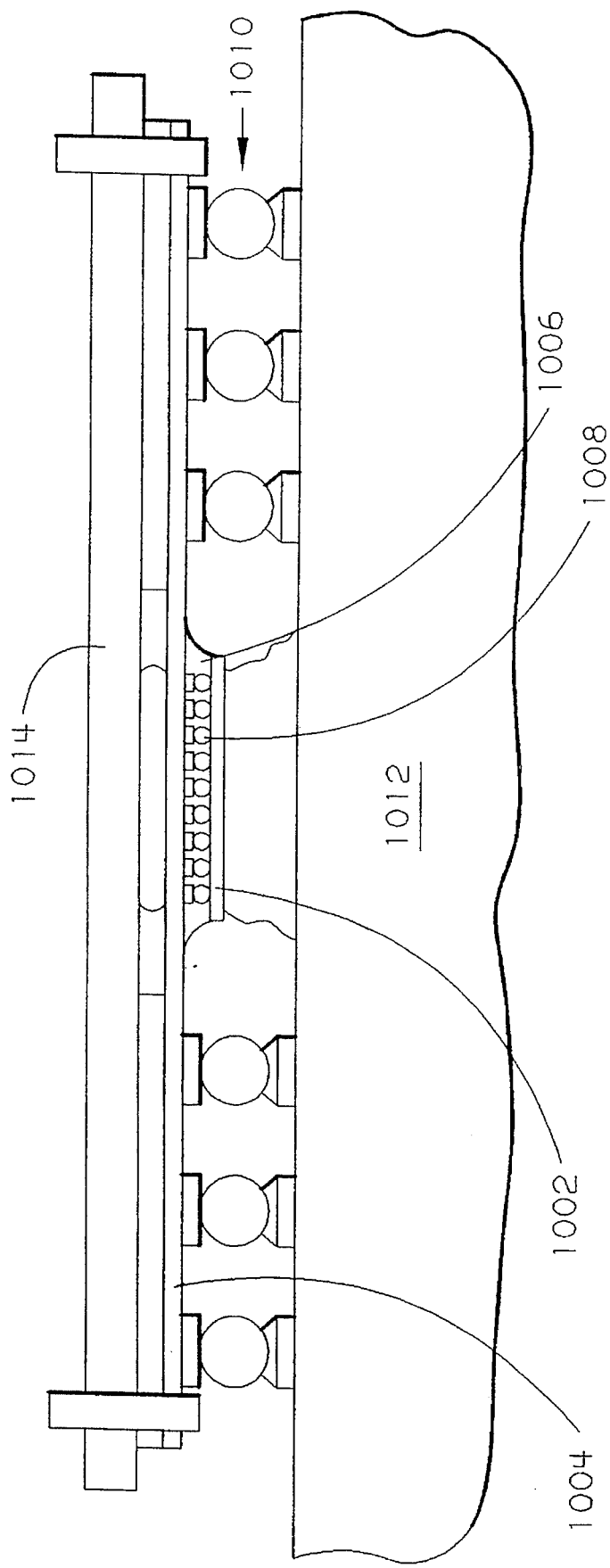
FIG. 10 is a schematic partial cross section of another specific embodiment of this invention showing a flip chip with encapsulated C4 connection to the bottom of a flexible chip carrier and with grid array solder ball connection to part of a circuit board.

FIG. 10 is a schematic partial cross section of another specific embodiment of the invention similar the embodiment of FIG. 9 showing a flip chip 1002 attached to the bottom surface of a one layer flexible substrate 1004. Encapsulant 1006 is dispensed around C4 connections 1008. A grid array solder balls 1010 connects the module to circuit board 1012. In this embodiment the optional heat spreader 1014 does not provide any protection against the formation of amoebas.

Figure 11:
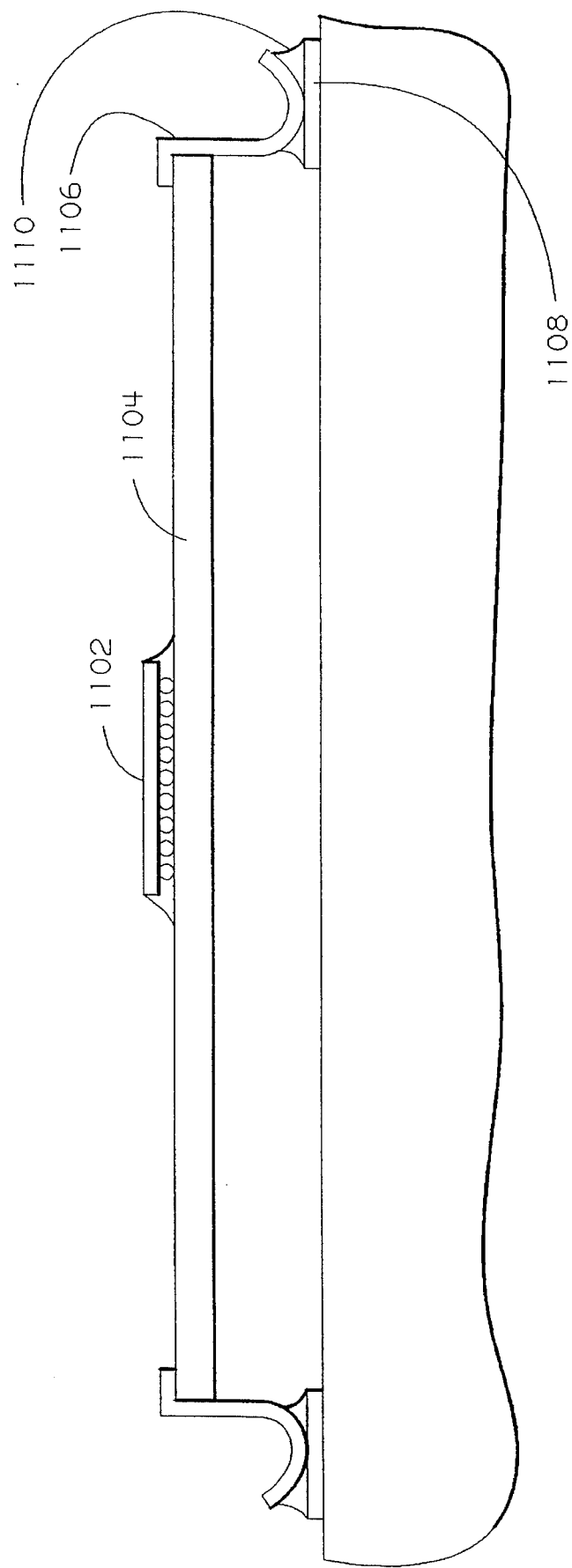
FIG. 11 schematically illustrates a specific embodiment of this invention in which a flip chip is attached to a leaded chip carrier.

FIG. 11 schematically illustrates a specific embodiment of this invention in which flip chip 1102 is attached to a leaded chip carrier 1104. Leads 1106 are surface mount attached to contacts 1108 by reheating low melting temperature joining material 1110.

Figure 12:
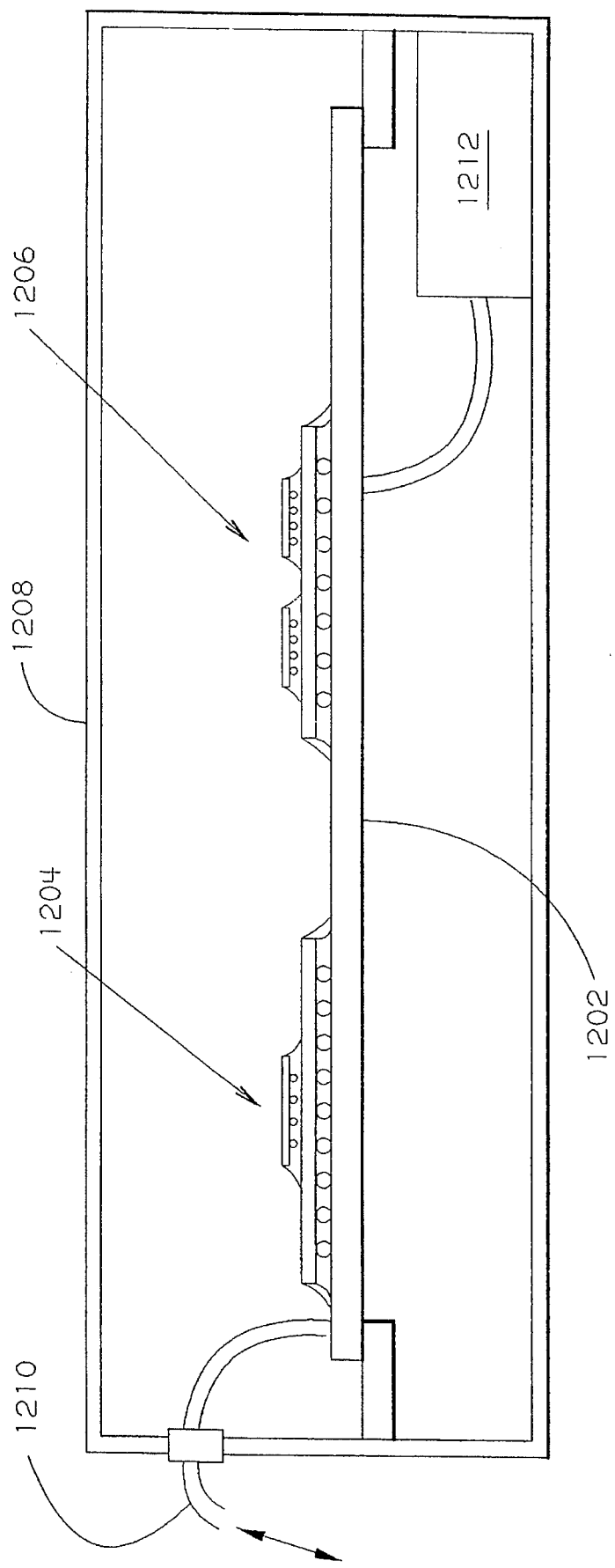
FIG. 12 schematically illustrates the information handling system of this invention.

FIG. 12 schematically illustrates the information handling system of this invention. An electrical interconnect assembly 1202 having two chip carrier modules 1204, 1206 is mounted in enclosure 1208 to protect the interconnect assembly from environmental hazards. Cable 1210 (optic or electrical) provides for I/O by connecting the interconnect assembly with computer peripherals (not shown) such as printers, keyboards, CRT's, and other information handling systems in a network. Power supply 1212 is electrically connected with the interconnect assembly to activate it.

While this invention has been described in relation to preferred embodiments, it will be understood by those skilled in the art that changes in the details of the processes and structures may be made without departing from the spirit and scope of this invention.

What we claim is:

1. Apparatus for manufacturing an interconnect assembly, comprising:

an organic, flip-chip carrier substrate;

a flip-chip connected directly to the substrate using an array of reflow solder connections, to form a flip-chip carrier with the chip separated from the substrate by a volume around the connections;

an organic encapsulant material filling the volume between the substrate and connected flip-chip to protect the solder connections and form a finished carrier; and means for controlling the level of moisture in the encapsulant between the flip-chip and carrier substrate to provide a sufficiently low level for subsequent solder attachment without forming solder bridges between the connections.

2. The apparatus of claim 1 in which the means for controlling the level of moisture includes means to prevent the diffusion of moisture into the encapsulant in the carrier.

3. The apparatus of claim 2 in which the means to prevent the diffusion of moisture includes means to store the finished carrier at an temperature elevated above ambient of at least about 40° C.

4. The apparatus of claim 2 in which the means for controlling the diffusion of moisture include means to store the finished carrier in a sealed approximately air tight bag.

5. The apparatus of claim 1 in which the means for controlling the level of moisture includes means to heat the finished carrier for baking the finished carrier at a temperature of at least 100° C.

6. The apparatus of claim 2 in which the means for controlling the diffusion of moisture includes means to assure using finished carriers within one week of their exposure to ambient atmosphere.

7. The apparatus of claim 4 in which means to store finished carrier in a sealed bag include:

a sealed plastic approximately air tight bag enclosing a multiple of finished carriers; and containers of dessicant material exposed to an atmosphere in the plastic bag, enclosed in the plastic bag with the finished carriers.

8. The apparatus of claim 5 in which the means for baking the finished carrier includes means to heat the finished carrier to at least 125° C.

9. The apparatus of claim 5 further including timing means to assure that the finished carrier is heated for a sufficient time.

10. The apparatus of claim 9 further including timing means to assure that the finished carrier is heated at least 12 hours.

11. The apparatus of claim 5 further including means for determining the time or temperature of baking depending on the humidity level or time of exposure to moisture.

12. The apparatus of claim 1 in which the organic substrate is a flexible laminate including layers of polyimide and copper.

13. The apparatus of claim 1 in which the substrate includes reinforcing fibers.

14. The apparatus of claim 13 in which the fibers are fiberglass and the substrate includes an epoxy filler.

15. The apparatus of claim 4 in which the bag contains dessicant.

* * * * *